US010242842B2

(12) United States Patent
Man et al.

(10) Patent No.: US 10,242,842 B2
(45) Date of Patent: Mar. 26, 2019

(54) METHOD FOR CROSS-SECTION PROCESSING AND OBSERVATION AND APPARATUS THEREFOR

(71) Applicant: HITACHI HIGH-TECH SCIENCE CORPORATION, Minato-ku, Tokyo (JP)

(72) Inventors: Xin Man, Tokyo (JP); Atsushi Uemoto, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/465,925

(22) Filed: Mar. 22, 2017

(65) Prior Publication Data

US 2017/0278668 A1    Sep. 28, 2017

(30) Foreign Application Priority Data

Mar. 25, 2016    (JP) ................................ 2016-062512
Mar. 17, 2017    (JP) ................................ 2017-053714

(51) Int. Cl.
*H01J 37/28*    (2006.01)
*H01J 37/20*    (2006.01)
(Continued)

(52) U.S. Cl.
CPC .......... *H01J 37/222* (2013.01); *G02B 21/361* (2013.01); *H01J 37/244* (2013.01);
(Continued)

(58) Field of Classification Search
CPC ........ H01J 37/28; H01J 37/20; H01J 37/3005; H01J 37/08; H01J 37/244; H01J 37/265;
(Continued)

(56) References Cited

U.S. PATENT DOCUMENTS 5,852,298 A * 12/1998 Hatakeyama ........... H01J 37/20
                                                             250/442.11
6,373,070 B1   4/2002 Rasmussen .............. 250/492.21
(Continued)

FOREIGN PATENT DOCUMENTS

JP    2008 270073    11/2008

OTHER PUBLICATIONS

Mee-Hae Kim et al., "Characterization of spatial cell distribution in multilayer sheet of human keratinocytes through a stereoscopic cell imaging system," Journal of Bioscience and Bioengineering, vol. 112 No. 3, pp. 289-291, 2011.
(Continued)

*Primary Examiner* — David A Vanore
(74) *Attorney, Agent, or Firm* — Adams & Wilks

(57) ABSTRACT

A method for cross-section processing and observation, and apparatus therefor, includes performing a position information obtaining process of observing the entirety of a sample by using an optical microscope or an electron microscope, and obtaining three-dimensional position coordinate information of a particular observation target object included in the sample; performing a cross-section processing process of irradiating a particular region in which the object is present by using a focused ion beam based on the information, and exposing a cross section of the region; performing a cross-section image obtaining process of irradiating the cross section by using an electron beam, and obtaining a cross-section image of a predetermined size region including the object; and performing a three-dimensional image obtaining process of repeating the cross-section processing process and the cross-section image obtaining process at predetermined intervals in a predetermined direction, and obtaining a three-dimensional image from the multiple cross-section images.

6 Claims, 14 Drawing Sheets

(51) Int. Cl.
*H01J 37/22* (2006.01)
*G02B 21/36* (2006.01)
*H01J 37/244* (2006.01)
*H01J 37/30* (2006.01)
*H01J 37/317* (2006.01)

(52) U.S. Cl.
CPC .............. *H01J 37/28* (2013.01); *H01J 37/30* (2013.01); *H01J 37/3178* (2013.01); *H01J 2237/221* (2013.01); *H01J 2237/226* (2013.01)

(58) Field of Classification Search
CPC .......... H01J 37/285; H01J 37/30; H01J 37/22; H01J 37/292; H01J 37/3007; H01J 2237/31749; H01J 2237/206; H01J 2237/208; H01J 2237/2806; H01J 2237/0042; H01J 2237/006; H01J 2237/20207; H01J 2237/20214; G01N 23/2202; G01N 2223/104; G01N 2223/418; G01N 2223/611
USPC .... 250/442.11, 310, 311, 309, 423 R, 492.1, 250/492.2, 492.21
See application file for complete search history.

(56) References Cited

U.S. PATENT DOCUMENTS

| | | | | |
|---|---|---|---|---|
| 6,538,254 | B1* | 3/2003 | Tomimatsu | H01J 37/3056 250/442.11 |
| 9,347,896 | B2* | 5/2016 | Man | G01N 23/20091 |
| 9,396,905 | B2* | 7/2016 | Kuramoto | H01J 37/222 |
| 9,412,560 | B2* | 8/2016 | Stone | G01N 23/2255 |
| 9,548,185 | B2* | 1/2017 | Suzuki | H01J 37/3056 |
| 9,633,819 | B2* | 4/2017 | Phaneuf | H01J 37/222 |
| 9,679,743 | B2* | 6/2017 | Fujii | H01J 37/222 |
| 9,761,409 | B2* | 9/2017 | Nomaguchi | H01J 37/22 |
| 2004/0158409 | A1 | 8/2004 | Teshima et al. | 702/22 |
| 2005/0035291 | A1* | 2/2005 | Hill | H01J 37/026 250/309 |
| 2005/0140379 | A1* | 6/2005 | Furukawa | G01R 31/307 324/750.19 |
| 2007/0018099 | A1* | 1/2007 | Chitturi | G01B 15/08 250/310 |
| 2009/0230299 | A1* | 9/2009 | Shichi | H01J 27/10 250/282 |
| 2010/0320171 | A1* | 12/2010 | Mao | B82Y 10/00 216/65 |
| 2011/0011190 | A1 | 1/2011 | Subramaniam | 73/866.5 |
| 2013/0075606 | A1 | 3/2013 | Uemoto et al. | 250/310 |
| 2013/0081882 | A1* | 4/2013 | Lin | G01N 1/32 175/428 |
| 2014/0226003 | A1 | 8/2014 | Phaneuf et al. | 348/80 |
| 2014/0291508 | A1 | 10/2014 | Uemoto et al. | 250/306 |
| 2014/0353500 | A1* | 12/2014 | Tsuneta | H01J 37/20 250/311 |
| 2015/0228450 | A1* | 8/2015 | Uemoto | H01J 37/20 250/311 |
| 2016/0247662 | A1* | 8/2016 | Fujii | H01J 37/222 |
| 2017/0278668 | A1* | 9/2017 | Man | G02B 21/361 |

OTHER PUBLICATIONS

European Search Report dated Aug. 1, 2017 in Application No. 17162713.6.

European Search Report dated Dec. 1, 2017 issued in Application No. EP 17 16 2713.

Mee-Hae Kim et al: "Characterization of spatial cell distribution in multilayer sheet of human keratinocytes through a stereoscopic cell imaging system", Journal of Bioscience and Bioengineering, Elsevier, Amsterdam, NL, vol. 112, No. 3, May 30, 2011 (May 30, 2011), pp. 289-291, XP028280011, ISSN: 1389-1723, DOI: 10.1016/J.JBIOSC. 2011.05.015 [retrieved on Jun. 8, 2011].

* cited by examiner

METHOD FOR CROSS-SECTION PROCESSING AND OBSERVATION AND APPARATUS THEREFOR

CROSS REFERENCES TO RELATED APPLICATIONS

This application claims the benefit of Japanese Patent Applications No. 2016-062512 and No. 2017-053714, filed Mar. 25, 2016 and Mar. 17, 2017, which are hereby incorporated by reference in their entirety into this application.

BACKGROUND OF THE INVENTION

1. Technical Field

The present invention relates generally to a method for cross-section processing and observation, and apparatus therefore, the method forming a particular region including a particular observation target object of a sample by using a focused ion beam, irradiating the particular region by using an electron beam to obtain a cross-section image, and obtaining a three-dimensional image of the particular observation target object.

2. Description of the Related Art

For example, as a method of interpreting or observing an internal structure of a sample such as a semiconductor device, etc. or performing a three-dimensional observation thereof, a method of cross-section processing and observation (for example, Patent Document 1) is well known. The method includes: by using a composite charged particle beam device having a focused ion beam (FIB) column and an electron beam (EB) column, repeating both cross-section processing using a focused ion beam (FIB) and scanning electron microscopy (SEM) observation using an electron beam (EB) irradiating a cross section so as to obtain multiple cross-section images of a target sample, and obtaining a three-dimensional image of the sample by overlaying the multiple cross-section images thereafter.

The method of cross-section processing and observation is a method called "Cut&See" in which cross-section processing using a FIB is referred to as "Cut" and cross-section observation using an EB is referred to as "See", Cut and See are repeated to obtain a three-dimensional image. In the method, by using the obtained three-dimensional image, it is possible to view a three-dimensional shape of a target sample in various directions. In addition, it is possible to reproduce an arbitrary cross-section image of a target sample, something impossible using other methods.

As a specific example, etching processing is performed by irradiating a sample with an FIB to expose a cross section of the sample. Next, SEM observation is performed on the exposed cross section to obtain a cross-section image. Etching processing is performed again to expose a subsequent cross section. Next, SEM observation is performed again to obtain a second cross-section image. As described above, multiple cross-section images are obtained by repeating the etching processing and the SEM observation along an arbitrary direction of the sample. Lastly, the obtained multiple cross-section images are overlaid, whereby a three-dimensional image through which the inside of the sample can be seen is obtained.

Document of Related Art (Patent Document 1) Japanese Patent Application Publication No. 2008-270073

SUMMARY OF THE INVENTION

However, for example, when a sample of an observation target is a biological sample such as a cell, etc., the sample is fixed to an embedding block by being embedded by an embedding agent such as paraffin. With such a biological sample as a processing and observation target, when selectively obtaining a three-dimensional image having high resolution of only a particular observation target object such as extremely small cells, etc. being dispersed in a target sample, the embedding block is observed by using an FIB or an EB. In this case, only a surface layer of the embedding block is observed, and thus it is impossible to specify the existence position of the particular observation target object such as cells, etc. being dispersed in the target sample (embedding block). Therefore, when the Cut & See method is applied on a sample in which particular observation target objects are scattered, the entire sample is set as a processing region in which an FIB is used. In addition, "Cut & See" is repeatedly performed on the entire sample, and it is required to present a particular observation target object in a processing cross section, and thus considerable time is required for observation.

In addition, when "Cut&See" is repeatedly performed on such entire sample, a massive number of cross-section images are obtained. Therefore, in order to obtain a three-dimensional image of a particular observation target object, it is required to extract only a cross-section image of a portion including a particular observation target object among the massive number of cross-section images. This process is ineffective and takes a great deal of time. Particularly, in a case of a biological sample, a particular observation target object of most biological samples is provided in an extremely small size. In order to obtain a three-dimensional image of the particular observation target object with high resolution, it is desired to repeat SEM observation with a large field of view by narrowing processing intervals through an FIB. Consequently, a massive number of cross-section images are obtained relative to the entire sample, and images except the cross-section images of the particular region including the particular observation target object are useless. Accordingly, an image processing apparatus is overloaded to process or temporarily keep such useless cross-section images.

In addition, when a particular observation target object is not present in a sample, "Cut & See" that is performed on an entire sample and which takes a long time is useless. Thus, such a method is an obstacle to effectively performing observation.

Accordingly, the present invention has been made keeping in mind the above problems, and the present invention is intended to propose a method for cross-section processing and observation, and apparatus therefore, the method expeditiously and effectively observing only a particular region including a particular observation target object in a sample, thereby easily obtaining a three-dimensional image of the particular observation target object.

In order to accomplish the above object, the present invention provides a method for cross-section processing and observation, and apparatus therefore.

That is, the method for cross-section processing and observation includes: a process of obtaining position information, by observing the entirety of a sample of observation target through an optical microscope or an electron microscope, obtaining an approximate three-dimensional position coordinate information of a particular observation target object included in the sample; a process of cross-section processing, based on the three-dimensional position coordinate information, by irradiating a focused ion beam towards a particular region in which the particular observation target object is present in the sample, exposing a cross-section of the particular region; a process of obtaining a cross-sectional image, by irradiating an electron beam on the cross-section, obtaining an image of a region of a predetermined size including the particular observation target object; and a process of generating a three-dimensional image, by repeatedly performing the process of cross-section processing and the process of obtaining a cross-sectional image at predetermined intervals along a predetermined direction a plurality of times, constructing a three-dimensional image including the particular observation target object from a plurality of the cross-sectional images obtained.

According to the method for cross-section processing and observation of the present invention, a sample of an observation target is observed by using an optical microscope column in advance, and position coordinate information of XYZ directions in which a particular observation target object is present is obtained and preserved. A confocal stereoscopic microscope is used as an optical microscope column to change a focal point position while XY position coordinates are fixed, whereby a position coordinate of a Z (depth) direction is obtained Based on the three-dimensional coordinate information of the particular observation target object, cross section exposure processing is performed on the sample of the observation target by using the FIB. Here, a portion in which a particular observation target object is not present is processed by using the FIB with wide processing intervals for a short time, and a cross-section image is not obtained. In addition, based on the position coordinate information, when reaching to a particular region including a particular observation target object, a sample is processed with predetermined narrow intervals. Among the processed cross sections, an SEM cross-section image of a portion including the particular observation target object is obtained.

In addition, a processing position of an FIB and an SEM image are preserved as one set. When obtaining image data of a particular region including a particular observation target object is completed, obtaining a cross sectional image and FIB processing with narrow intervals are terminated, and FIB processing with wide intervals is performed for a short time until reaching to a subsequent particular region. In this way, when cross-section images of all particular regions are obtained, processing is terminated. Alternatively, with consistent processing intervals, a cross-section image of a portion in which a target object is not present is not obtained, but a cross-section image of a portion in which a target object is present is obtained. Consequently, desired information may be effectively obtained.

As described above, according to the method for cross-section processing and observation of the present invention, a coordinate position of the particular observation target object is identified by optical observation with the optical microscope column, thereby expeditiously and effectively performing observation of the particular region including the particular observation target object, and easily obtaining a three-dimensional image of the particular observation target object.

In the present invention, plural kinds of the particular observation target objects are set, and the process of cross-section processing is performed on each of the particular observation target objects.

In addition, in the present invention, the optical microscope is a confocal stereoscopic microscope.

In addition, the process of obtaining a cross-sectional image may be further characterized by additionally obtaining a cross sectional composite image of the particular region including the particular observation target object by detecting energy dispersive X-rays of the cross-section, and the process of generating a three-dimensional image may be further characterized by constructing a three-dimensional composite image including the particular observation target object from a plurality of the cross sectional composite images obtained.

An apparatus for cross-section processing and observation includes: a sample stage on which a sample including a particular observation target object is placed; a focused ion beam column irradiating a focused ion beam on the sample; an electron beam column irradiating an electron beam on the sample; an optical microscope column optically observing the sample; a secondary electron detector detecting a secondary electron generated from the sample or a back-scattered electron detector detecting a back-scattered electron; and a control device specifying a location where the particular observation target object is present within the sample using the optical microscope column, and constructing a three-dimensional image of a particular region including the particular observation target object.

According to the apparatus for cross-section processing and observation of the present invention, approximate coordinate information of the particular region including the particular observation target object in the sample may be identified by using the optical microscope column in advance. Therefore, when processing the sample by using the focused ion beam column, a portion beyond the particular region is roughly processed, and the particular region is minutely processed by expeditiously accessing the particular region and using the focused ion beam column. Consequently, a cross-section image of the particular region including the particular observation target object may be obtained in high resolution in a short time.

In addition, according to the apparatus for cross-section processing and observation of the present invention, among cross sections of a sample, which are obtained by using the focused ion beam column, only the particular region including the particular observation target object is irradiated by the electron beam of the electron beam column, and thus data of a cross-section image is obtained. Accordingly, in comparison with a conventional observation apparatus obtaining cross-section images across an entire sample, capacity for preserving data of a cross-section image is remarkably reduced, such that the apparatus for cross-section processing and observation may be manufactured with low cost.

In addition, when a cross-section image of the particular region including the particular observation target object is obtained by using the electron beam, the image is obtained in high resolution, whereby a three-dimensional image may be obtained in high resolution in comparison with a conventional observation apparatus obtaining cross-section images across an entire sample.

According to the present invention, it is possible to process a particular region including a particular observation target object with high resolution imaging, thereby easily and expeditiously generating a high resolution three-dimensional image of the particular observation target object.

In addition, the present invention may be further characterized by having an EDS detector for detecting characteristic X-rays generated from the sample and characterized in that the control device constructs a three-dimensional composite image of the particular region.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
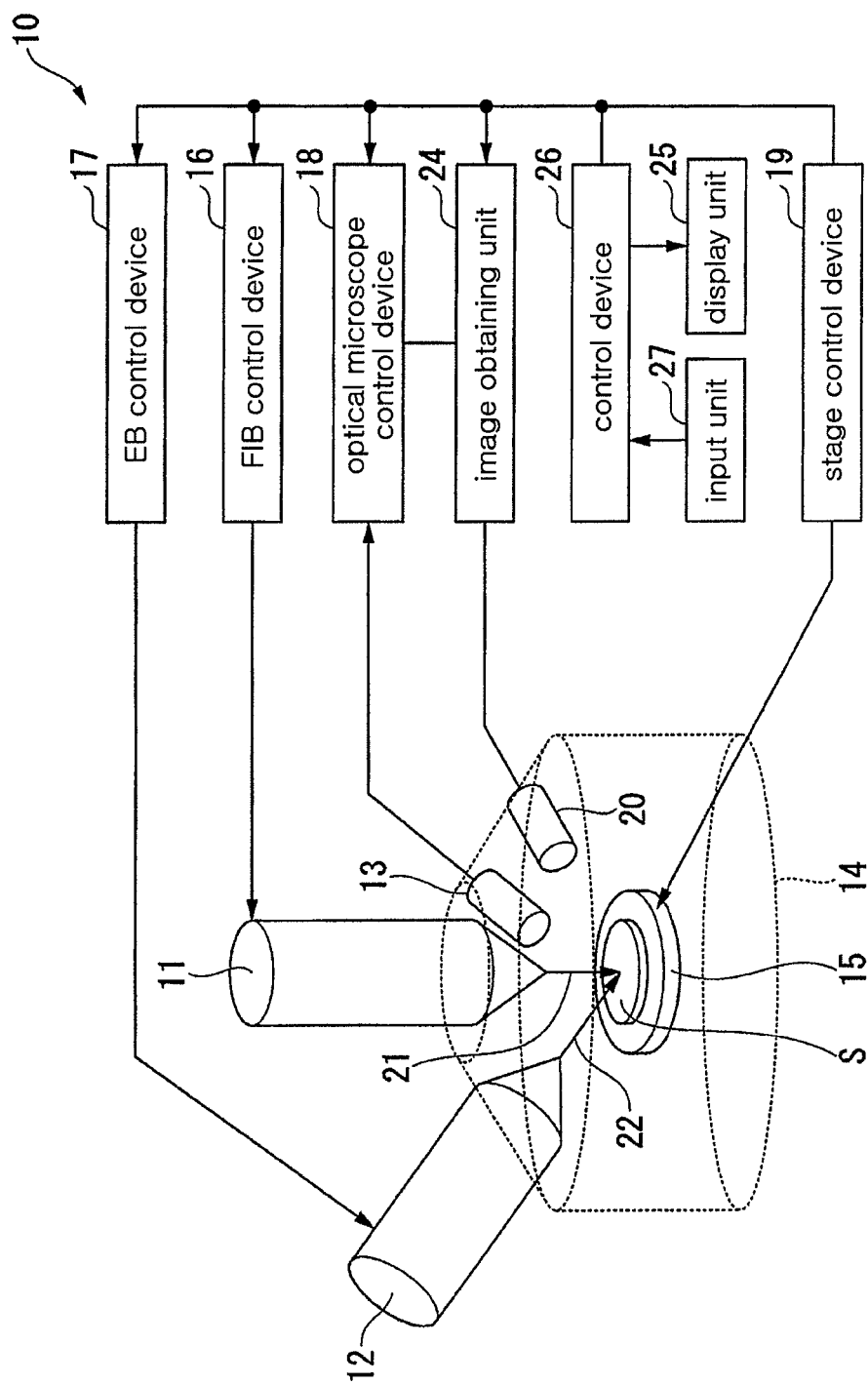
FIG. 1 is a schematic configuration view showing an apparatus for cross-section processing and observation according to a first exemplary embodiment of the present invention.

A method for cross-section processing and observation, and apparatus therefore according to embodiments of the present invention are described below with reference to the accompanying drawings. Respective illustrative embodiments described below are specific examples for easily understanding the scope of the present invention and do not limit the present invention unless specified otherwise. In addition, in the drawings used in the following description, major components may be enlarged and illustrated in order to make characteristics of the present invention easier to understand, and a dimensional ratio of each component may not be the same as that of the actual one.

Apparatus for Cross-Section Processing and Observation: First Exemplary Embodiment FIG. 1 is a schematic configuration view showing an apparatus for cross-section processing and observation according to a first exemplary embodiment of the present invention.

According to the embodiment of the present invention, the apparatus 10 for cross-section processing and observation includes: a focused ion beam (FIB) column 11; an electron beam (EB) column 12; an optical microscope (OM) column 13; and a sample chamber 14 with a stage (sample stage) 15. The focused ion beam column 11, the electron beam column 12, and the optical microscope column (optical microscope) 13 are fixed to the sample chamber 14.

The focused ion beam column 11, the electron beam column 12, and the optical microscope column 13 irradiate a sample S placed on the stage 15 by using a focused ion beam (FIB) 21, an electron beam (EB) 22, and visible light (VL) 23, respectively.

The focused ion beam column 11 and the electron beam column 12 are arranged to enable the focused ion beam 21 emitted from the focused ion beam column 11 and the electron beam 22 emitted from the electron beam column 12 to be orthogonal to each other on a sample S. Therefore, a processed cross section is irradiated by an electron beam being perpendicular thereto, whereby a cross-section image may be obtained in high resolution.

Here, as an example of the sample S, a biological sample embedded in resin, etc. is used. An observer observes a particular observation target object (attention part), for example, a cell, etc. that is included (contained) in such a biological sample. When a sample is a transparent biological sample, unlike ordinary materials such as metal, etc., the inside of the biological sample may be observed by using the optical microscope column (optical microscope) 13, and thus the existence position of the attention part may be identified.

The optical microscope column (optical microscope) 13 is arranged to observe in a direction nearly identical to a direction of emitted electron beam 22. In addition, a part or all of the optical microscope column 13 may be provided in the sample chamber 14, or may be provided in another sample chamber placed separately from the sample chamber 14. In either case, it is desirable to arrange the optical microscope column to observe in a direction nearly identical to a direction of emitted electron beam.

As the optical microscope column (optical microscope) 13, it is desirable to use, for example, a confocal stereoscopic microscope having a laser light source. The confocal stereoscopic microscope may obtain an image of a sample S in high resolution in a height (depth) direction (direction along an optical axis of an optical microscope) of the sample S. The confocal stereoscopic microscope is usually used for obtaining an image of extremely small uneven portions on a surface of a sample. However, in the embodiment of the present invention, the confocal stereoscopic microscope is used for obtaining an image of an internal structure of a sample S in high resolution along a height direction of the sample.

For example, in a case of a transparent sample S such as a biological sample, etc., a laser beam penetrates the transparent sample S, and an image of foreign substances or tissues that are not penetrated by a laser beam in the transparent sample S may be obtained. In addition, as everyone knows, XY surface image information of a sample S is produced by laser scanning of a scanning apparatus scanning a sample S in two-dimensions along respective directions of X and Y axes. Information of a height (depth) direction (Z-axis) of a sample adopts a Z position (height information of a sample S when luminance is maximum, thereby obtaining a three-dimensional image.

However, in an image obtained by using the optical microscope column (optical microscope) 13, it is impossible to know a rear structure of a particular observation target object presented as an image because the particular observation target object is opaque. As described above, only the shape of the topmost surface that a laser beam is reflected off is known. However, position information (XY-coordinates) and depth position information (Z-coordinate) in a surface in which a particular observation target object is present are obtained such that it is possible to establish a criterion for where a particular observation target object is present in a sample S by using "Cut & See".

In the meantime, in a case of observation using a focused ion beam 21 or an electron beam 22, even through a sample S is transparent, only information of an outermost surface shape of the sample S is obtained. Therefore, even though it was known that a particular observation target object is present in the sample S, it is impossible to clarify the existence position (coordinate). In addition, due to a contrast difference between an optical microscope image and an SEM image, it is difficult to identify an attention part in the SEM image.

Therefore, with optical microscope observation using an optical microscope column (optical microscope) 13, a coordinate of a particular portion that is a small portion in a sample S including a particular observation target object may be obtained in advance of a Cut operation (cross-section processing process) of a sample S. In addition, the Cut operation (cross-section processing process) is progressed based on the coordinate of the particular region including the particular observation target object. In order to clarify a portion for obtaining an SEM image through an electron beam 22 in regard to an exposed cross section, when the cross section has a distinguishing shape that is recognized by using an optical microscope column (optical microscope) 13 and an electron beam 22 in common, it is possible to specify a position (coordinate) of the particular observation target object by using a relative position relationship with the distinguishing shape, which is a criterion.

The stage 15 on which a sample S is placed is controlled by a stage control device 19, and may be moved in XYZ directions, and may be tilted, whereby the sample S may be moved in an arbitrary direction.

The apparatus 10 for cross-section processing and observation further includes: a focused ion beam (FIB) control device 16; an electron beam (EB) control device 17; and an optical microscope (OM) control device 18. The focused ion beam control device 16 controls a focused ion beam column 11 to emit a focused ion beam 21 at an arbitrary time. The electron beam control device 17 controls an electron beam column 12 to emit an electron beam 22 at an arbitrary time.

The optical microscope control device 18 controls an optical microscope column 13 to move a position of an optical focal point. Whenever the position is moved, an observation image of a sample S is obtained and stored. Along an optical axis of the optical microscope column 13, the focal point is slightly moved and stopped repeatedly in one direction to approach to or to be separated from the optical microscope column 13. When the focal point is stopped, an image of a sample S is obtained. In addition, it is possible to obtain an optical microscope image by fixing the focal point of the optical microscope column 13 and using the stage control device 19 to slightly move the stage 15 in one of upward or downward directions.

The apparatus 10 for cross-section processing and observation further includes a secondary electron detector 20. The secondary electron detector 20 irradiates a sample S by using a focused ion beam 21 or an electron beam 22, and detects a secondary electron generated from the sample S.

In addition, it is desirable to install a back-scattered electron detector (not shown) in addition to the secondary electron detector 20 or instead of the secondary electron detector 20. The back-scattered electron detector detects back-scattered electrons that are back-scattered by the electron beam from the sample S. A cross-section image of the sample S may be obtained by using the back-scattered electrons.

The apparatus 10 for cross-section processing and observation includes: an image obtaining unit 24 obtaining an observation image of a cross section of a sample S; and a display unit 25 displaying the observation image. The image obtaining unit 24 obtains an SEM image by using both a signal for emitting the electron beam 22 and a signal of the secondary electron detected by the secondary electron detector 20. The display unit 25 displays the SEM image obtained by the image obtaining unit 24. The display unit 25 may be composed of, for example, a display device.

The apparatus 10 for cross-section processing and observation further includes: a control device 26; and an input unit 27. An operator inputs various control conditions of the apparatus 10 for cross-section processing and observation through the input unit 27. The input unit 27 outputs the input information to the control device 26. The control device 26 outputs a control signal to the focused ion beam control device 16, the electron beam control device 17, the optical microscope control device 18, the stage control device 19, the image obtaining unit 24, etc., and controls the entire operation of the apparatus 10 for cross-section processing and observation.

Apparatus for Cross-Section Processing and Observation: Second Exemplary Embodiment According to the above described first exemplary embodiment, a part or all of the optical microscope column (optical microscope) 13 is provided in the sample chamber 14, but the optical microscope column (optical microscope) 13 may be provided outside of the sample chamber 14.

Figure 6:
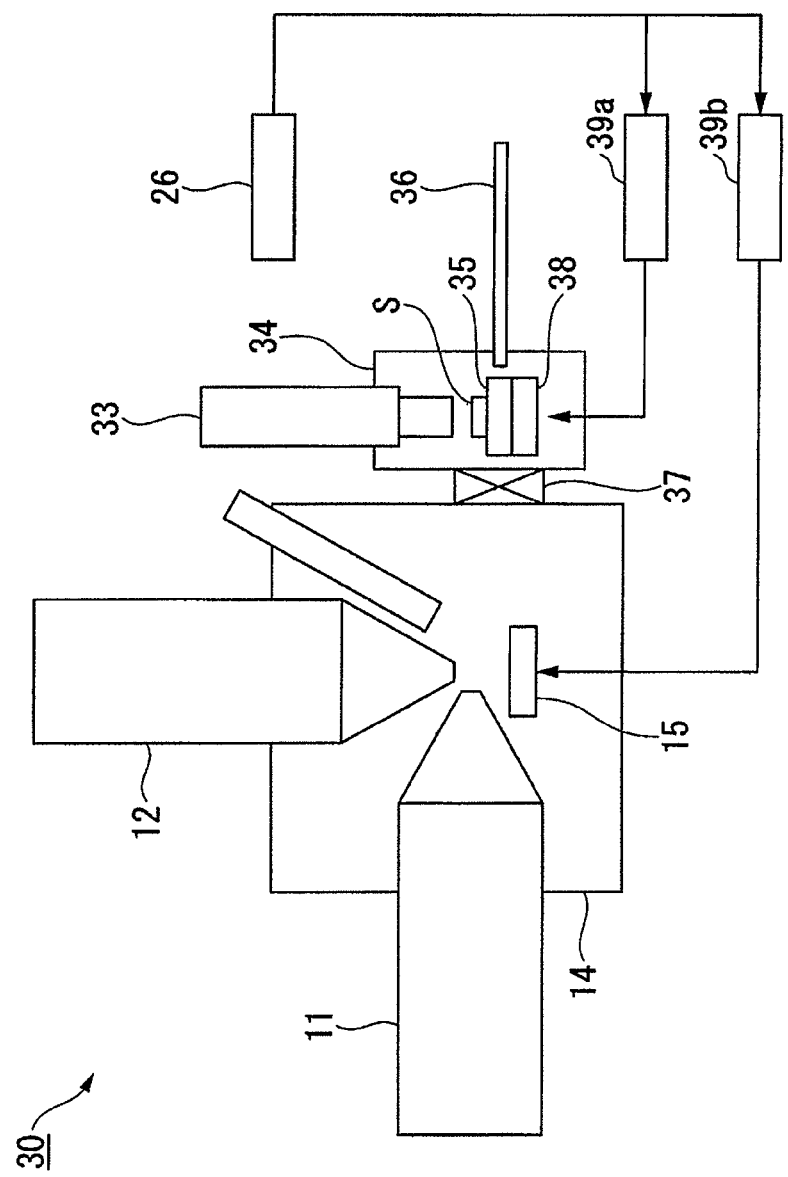
FIG. 6 is a schematic configuration view showing an apparatus for cross-section processing and observation according to a second exemplary embodiment of the present invention.

FIG. 6 is a schematic configuration view showing an apparatus for cross-section processing and observation according to a second exemplary embodiment of the present invention. The same elements of the first and second exemplary embodiments are designated by the same reference numerals, and repetitive description of the same elements is omitted. In an apparatus 10 for cross-section processing and observation, a second sample chamber 34 is provided outside of the sample chamber 14, and the optical microscope column (optical microscope) 33 is provided in the second sample chamber 34.

The second sample chamber 34 in which a part or all of the optical microscope column (optical microscope) 33 is provided has an inside being in a vacuum or atmospheric pressure condition. It is necessary for the sample chamber 14 in which the focused ion beam or the electron beam is emitted to have an inside being in a vacuum condition. However, there is no difficulty in having an inside of the optical microscope column (optical microscope) 33 with an atmospheric pressure condition. The volume of the sample chamber 14 in a vacuum condition may be low by providing the second sample chamber 34 in an atmospheric pressure condition, thereby enhancing efficiency in vacuum exhaust.

The sample S is moved between the sample chamber 14 and the second sample chamber 34 by both a sample holder 35 on which the sample S is placed and a transfer rod 36. When moving the sample, a sealing door (valve) 37 is opened by fixing the transfer rod 36 to the sample holder 35, next, the sample holder 35 that is separated from a stage 38 of the second sample chamber 34 is pushed into the sample chamber 14 by the transfer rod 36, and the sample holder 35 is fixed on the stage 15 in the sample chamber 14 thereafter.

Both a stage 15 of the sample chamber 14 and a stage 38 of the second sample chamber 34 having the optical microscope column (optical microscope) 33 are respectively controlled by stage control devices 39a and 39b. Coordinate information at the stages 15 and 38 is preserved at the control device 26. Based on coordinate information obtained at the stage 38 of the second sample chamber 34, the stage 15 of the sample chamber 14 may be operated with the stage 38. In addition, a focused ion beam control device, an electron beam control device, etc. are omitted in FIG. 6, but the second exemplary embodiment includes the same elements as the first exemplary embodiment in FIG. 1.

Apparatus for Cross-Section Processing and Observation: Third Exemplary Embodiment According to the above described second exemplary embodiment, the optical microscope column (optical microscope) 13 is provided in the second sample chamber 34 placed separately from the sample chamber 14, but it is unnecessary to provide a sample chamber for the optical microscope column (optical microscope) 13.

Figure 7:
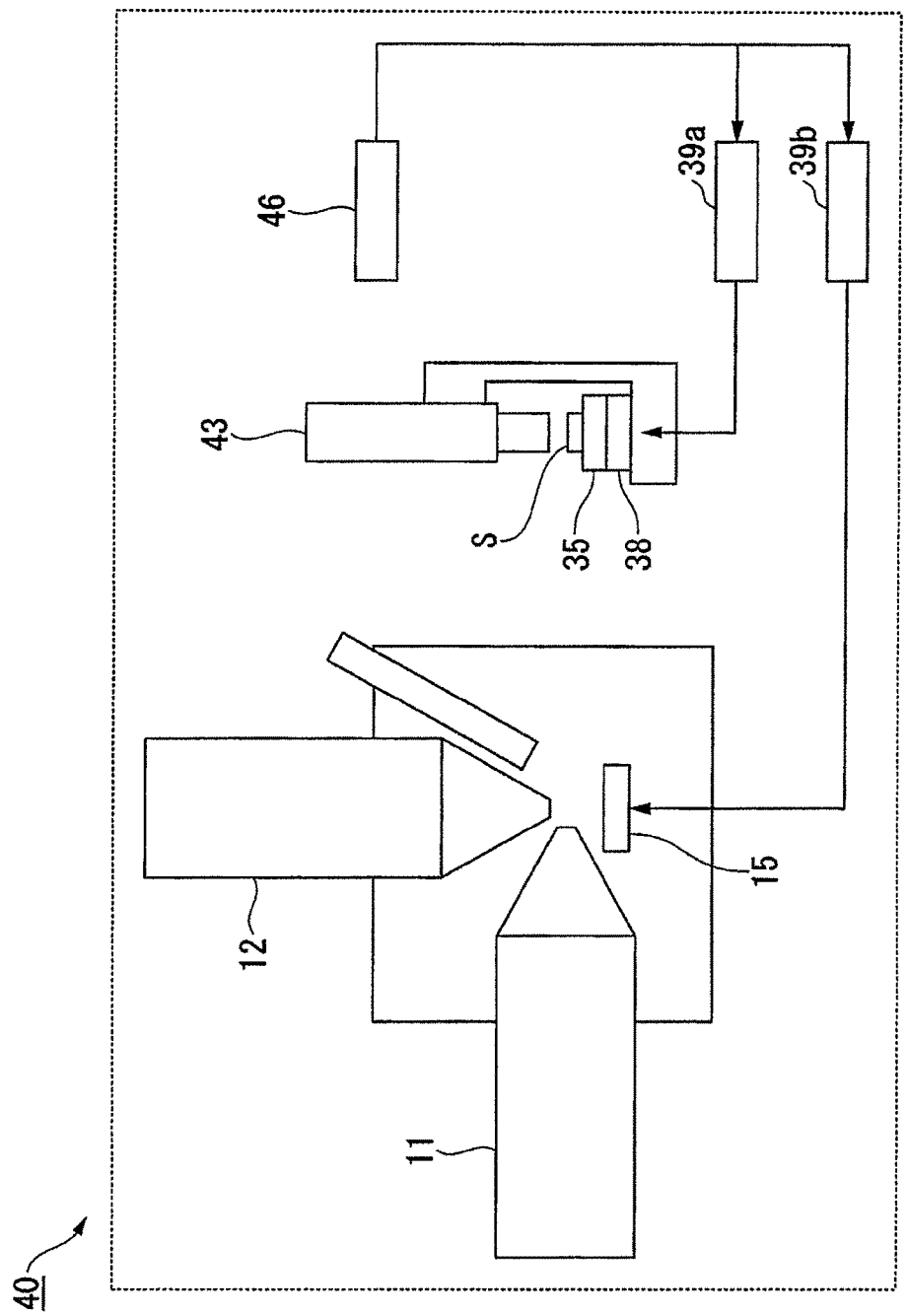
FIG. 7 is a schematic configuration view showing an apparatus for cross-section processing and observation according to a third exemplary embodiment of the present invention.

FIG. 7 is a schematic configuration view showing an apparatus for cross-section processing and observation according to a third exemplary embodiment of the present invention. The same elements of the second and third exemplary embodiments are designated by the same reference numerals, and repetitive description of the same elements is omitted. In an apparatus 40 for cross-section processing and observation, an optical microscope column (optical microscope) 43 is provided outside of the sample chamber 14 individually. In addition, a partially common control device 46 is provided to decipher a coordinate, which is obtained by the optical microscope column (optical microscope) 43, of a particular observation target object (attention part) in a sample S even by the focused ion beam control device or the electron beam control device (shown in FIG. 1). By separately providing the optical microscope column (optical microscope) 43 outside of the sample chamber 14, it is possible to place a device without any limitations, for example, placing and operating devices in respective chambers.

Figure 10:
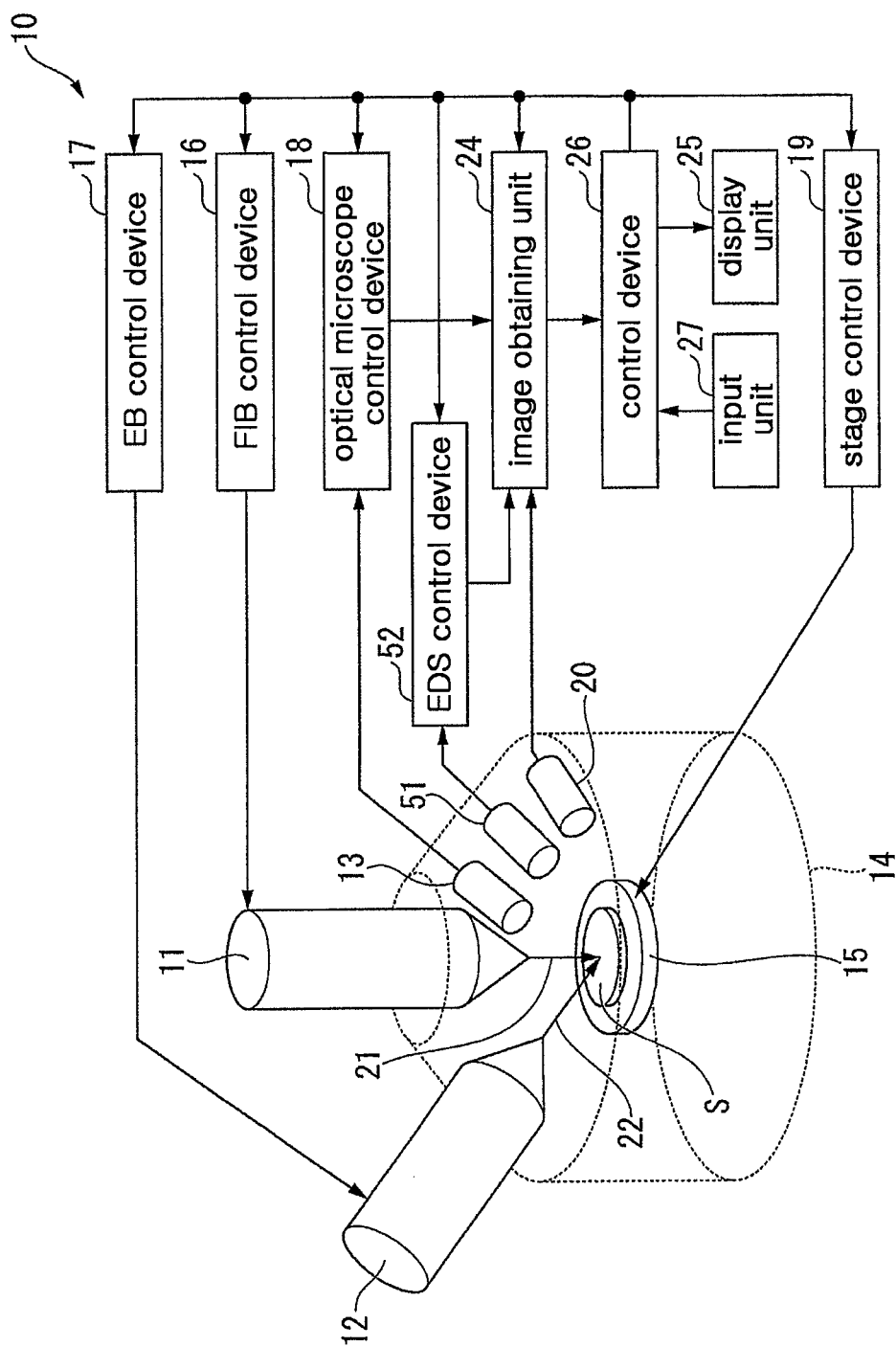
FIG. 10 is a schematic configuration view showing an apparatus for cross-section processing and observation according to a fourth exemplary embodiment of the present invention.

An Apparatus for Cross-Section Processing and Observation: Fourth Exemplary Embodiment FIG. 10 is a schematic configuration view showing an apparatus for cross-section processing and observation according to a fourth exemplary embodiment of the present invention. In addition, for the same configuration as a first exemplary embodiment, the same numbers will be designated, and an overlapping description will be omitted. An apparatus for cross-section processing and observation 50 comprises an EDS detector 51 for detecting X-rays generated from a sample S when an electron beam EB is irradiated on the sample S and an EDS control device 52 for controlling the EDS detector 51. X-rays generated from the sample S includes a characteristic X-ray for each substance of which the sample S is composed, substances of which the sample S is composed can be specified by these characteristic X-rays.

An image obtaining unit 24 forms a composite image of a specific cross-section of the sample S from scanning signals of electron beams 22 and characteristic X-ray signals detected from the EDS detector 51. A control device 26 constructs a three-dimensional composite image based on a plurality of composite images. In addition, a composite image (EDS image) specifies the substances of the sample S from the detected energy of characteristic X-rays at each electron-beam irradiation point and shows distribution of the substances of an irradiation region of electron beams 22.

A three-dimensional composition map of a particular region in the sample S can be constructed using an apparatus for cross-section processing and observation 50 according to a fourth exemplary embodiment. In addition, such a method of constructing a three-dimensional composition map using an apparatus for cross-section processing and observation 50 according to a fourth exemplary embodiment will be described in the method for cross-section processing and observation according to a fourth exemplary embodiment below.

In addition, an apparatus for cross-section processing and observation 50 according to a fourth exemplary embodiment comprises an optical microscope column 13 or a secondary electron detector 20 together with an EDS detector 51, but an optical microscope column 13 or a secondary electron detector 20 may be omitted.

Method for Cross-Section Processing and Observation: First Exemplary Embodiment

Hereinafter, an embodiment of a method for cross-section processing and observation according to a first exemplary embodiment of the present invention that uses the above described apparatus for cross-section processing and observation will be described with reference to FIGS. 1 and 2.

Figure 2:
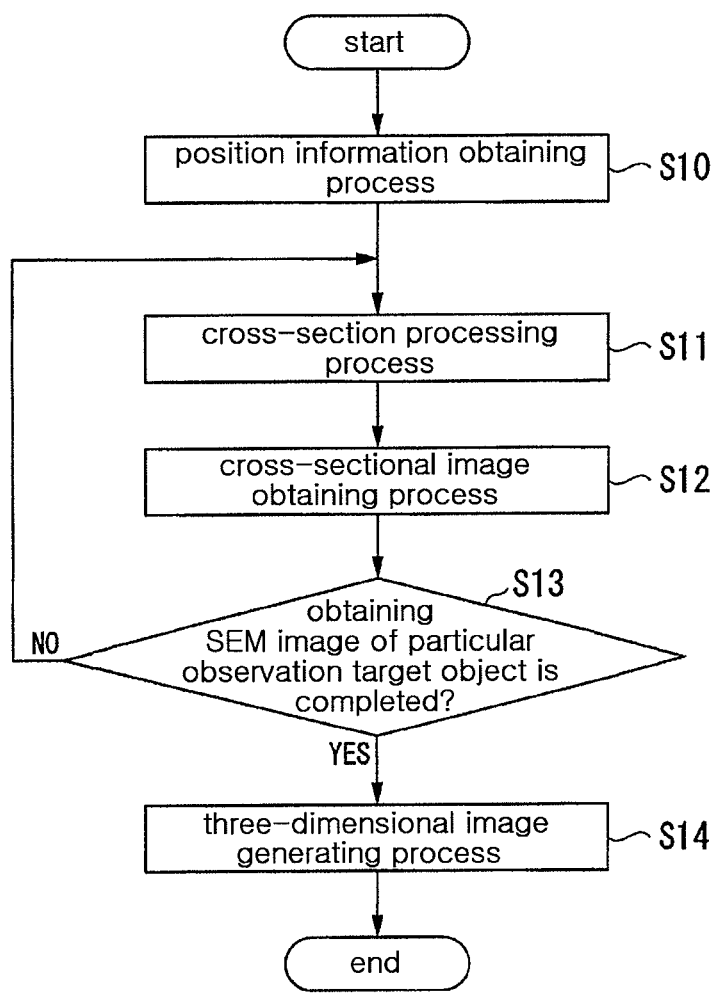
FIG. 2 is a flowchart showing a method for cross-section processing and observation according to a first exemplary embodiment of the present invention.

FIG. 2 is a flowchart showing a method for cross-section processing and observation according to a first exemplary embodiment of the present invention.

First, a sample S, which is a target, is observed by using an optical microscope column (optical microscope) 13, and position (XYZ-coordinates) information of a particular observation target object (attention part) included in the sample S is obtained (a position information obtaining process at step S10). The sample S is, for example, a biological sample. The sample S, which is a target, is fixed by being embedded in resin, etc. in advance, and is processed by drying, dehydration, etc. A biological sample manufacturing processes such as an embedding operation or dehydration operation, etc. may be performed by using already-known techniques.

When performing SEM observation on the sample S that is processed by such operations, an image of a surface of the sample S may be obtained, but an image of the inside of the sample S may not be obtained. However, when using the optical microscope column (optical microscope) 13, light penetrates a transparent sample S such as an organism, etc., but light does not penetrate a particular observation target object (attention part) such as foreign substances, tissues, etc. in the sample S. The particular observation target object (attention part) may be visualized due to a contrast difference.

Figure 3A:
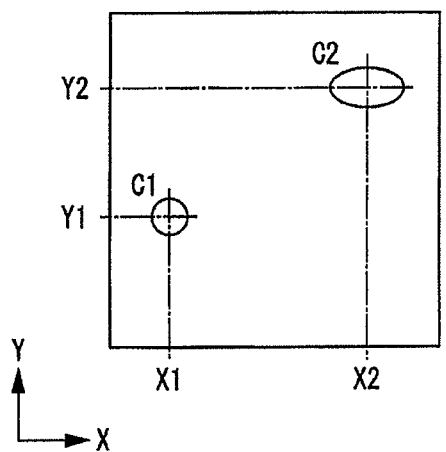
FIGS. 3(A) and 3(B) are schematic views showing observation of a sample by using an optical microscope column.

FIG. 3(A) is an optical microscope image (schematic view) for observation of a sample S by using the optical microscope column 13. FIG. 3(A) is a projection view of an image of a sample S that is observed by changing a focal point position from a surface of the sample to a predetermined depth thereof, and shows particular observation target objects (attention parts) C1 and C2 that are present within a view in one image. FIG. 3(A) is a coordinate system showing XY-coordinates of the optical microscope image in the lower left side of FIG. 3(A). Almost centric coordinates of a particular observation target object C1 are (X1, Y1), and almost centric coordinates of a particular observation target object C2 are (X2, Y2).

Figure 3B:
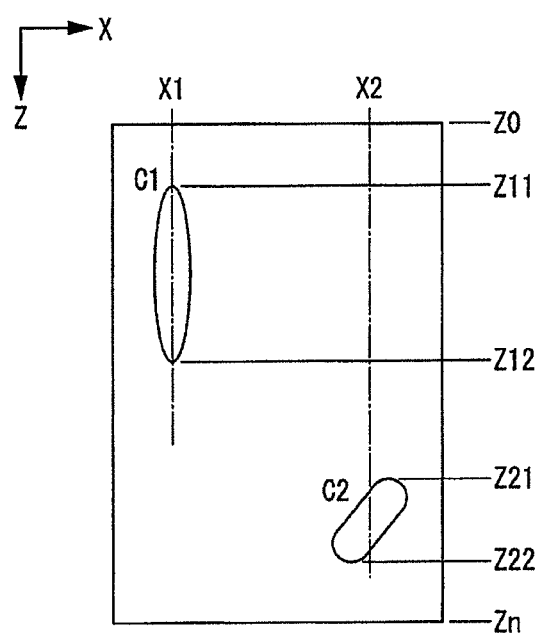

FIG. 3(B) is an optical microscope image (schematic view) showing a depth direction relative to the same view as the sample S of FIG. 3(A). A depth direction of the sample is the Z-coordinate, and is expressed as a surface Z0 of the sample S to an observation bottom surface Zn thereof. A focal point of the optical microscope column 13 is adjusted to face from a surface to the inside (depth direction Z) of the sample S sequentially. An optical microscope image and the relevant Z-coordinate for each focal point position are stored in the control device 26.

In addition, by using the optical microscope column 13, an optical microscope image (plane image) is obtained by repeating the adjustment of the focal point from a surface to a predetermined observation bottom surface Zn of the sample S. In this way, multiple optical microscope images (plane images) are obtained, and are composed (image processing). Consequently, a three-dimensional image of the sample S is obtained, such that it is possible to identify existence positions (coordinates) in the depth direction Z of the particular observation target objects (attention parts) C1 and C2 in the sample S. As described above, a sample S is observed by changing an optical focal point position at fixed XY-coordinates by using the optical microscope column (optical microscope) 13, and the particular observation target objects (attention parts) in the sample S are expressed as three-dimensional coordinates.

Next, based on the XY-coordinates information of the particular observation target objects (attention parts) obtained by using the optical microscope column (optical microscope) 13, a cross-section processing process is performed on the sample S, which is a target, by emitting the focused ion beam 21 from the focused ion beam column 11 (a cross-section processing process at step S11).

Figure 4A:
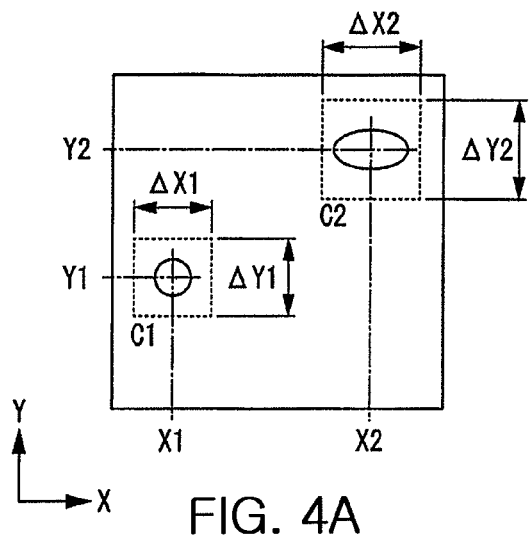
FIGS. 4(A) and 4(B) are schematic views showing a particular portion that is a portion for obtaining an SEM image.

FIG. 4(A) is a schematic view showing a particular portion (image obtained portion) that is a portion for obtaining an SEM image in regard to the particular observation target object C1 and the particular observation target object C2 shown in FIG. 3(A). In FIG. 4(A), an image obtained portion (particular portion) of the particular observation target object C1 is a rectangular portion with sides ΔX1 and ΔY1 that are lengths respectively defined by adding predetermined distances to the outermost ends of the particular observation target object C1, with coordinates (X1, Y1) that are almost the center of the particular observation target object C1, as the center. Similarly, an image obtained portion of the particular observation target object C2 is a rectangular portion with sides ΔX2 and ΔY2 that are lengths respectively defined by adding predetermined distances to the outermost ends of the particular observation target object C2, with coordinates (X2, Y2) as the center.

Such a predetermined distance is a spare portion for indicating a portion including a particular observation target object in three-dimensions. When the spare portion is excessively large, a three-dimensional image of a particular observation target object is small. When the spare portion is excessively small, it is difficult to see the three-dimensional image depending on an indication direction of a cross section. Therefore, an operator should properly determine the spare portion in advance depending on ways a particular observation target object is seen. For example, an image obtained range is defined by increasing respective lengths in XY directions of a projection view of a particular observation target object by about 10%.

Figure 4B:
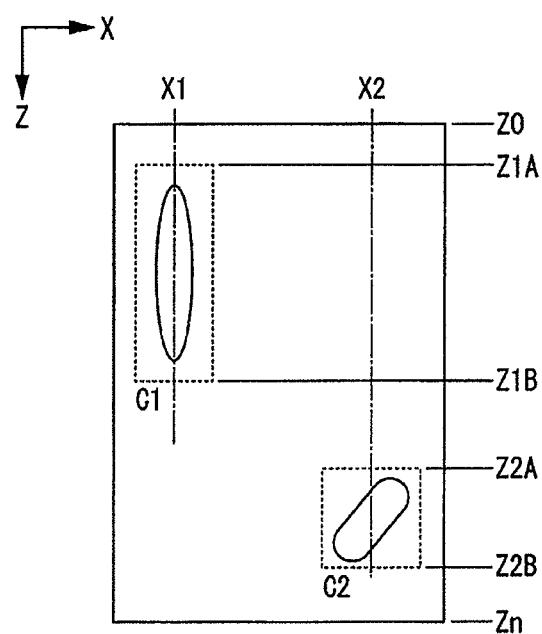

FIG. 4(B) is a projection view of a sample S in the depth direction Z. A processing region for exposing a cross section of the sample S with narrow intervals by using the focused ion beam 21 is determined from the image. Here, in FIG. 4(B), a position of appearance (upper portion of the particular observation target object) at which the particular observation target object C1 appears into a field of view is designated as Z1A, and a position of disappearance (lower portion of the particular observation target object) at which the particular observation target object C1 disappears from the field of view is designated as Z1B. Similarly, a position of appearance of the particular observation target object C2 is designated as Z2A, and a position of disappearance of the particular observation target object C2 is designated as Z2B.

A range for processing a sample S thinly with close intervals by using the focused ion beam 21 is determined, for example, by adding a predetermined length to each of an appearance coordinate and a disappearance position of a particular observation target object. The predetermined length is a spare portion for indicating a portion including a particular observation target object in three-dimensions. Regarding a Z direction, for example, a spare portion is defined as 10% of a Z direction length (Z12-Z11) of the particular observation target object C1. A processing region is defined as a region of Z1A to Z1B in Z-coordinates where the spare portion is added to the upper portion of Z11 and the lower portion of Z12 in Z-coordinates. Similarly, in a case of the particular observation target object C2, a cross section processing frame for processing a sample S thinly with close intervals by using the focused ion beam 21 is defined as Z2A to Z2B in Z-coordinates.

When processing intervals of a sample S using the focused ion beam 21 is the narrowest possible, a three-dimensional image of a particular observation target object has high resolution in a Z direction. In contrast, when a particular observation target object is extremely long in a Z direction, a number of SEM images are obtained, and thus accumulated image data is large. Therefore, it is desirable to observe and identify the size of a particular observation target object by using the optical microscope column (optical microscope) 13, and next, to examine both capacity of the accumulated image data and resolution for a three-dimensional image of the particular observation target object, and to determine processing intervals using the focused ion beam 21 thereafter.

In regions of Z0 to Z1A, Z1B to Z2A, and Z2B to Zn in Z-coordinates outside of the processing frame with narrow intervals, a cross-section processing is performed with lose intervals for a short time by using the focused ion beam 21. In addition, it is known that a particular observation target object does not exist in the region, thus it is unnecessary to obtain an SEM image. Consequently, it is possible to shorten time for the cross-section processing of the sample S and reduce memory capacity for the SEM image. Alternatively, the cross-section processing is performed at predetermined intervals. When a particular observation target object is present, an image is obtained. When the particular observation target object is not present, an image is not obtained. Consequently, it is possible to shorten time for the cross-section processing and reduce memory capacity for the SEM image.

Next, among processed cross sections of a sample S, an SEM image of a particular region including the particular observation target object is obtained, and is preserved with cross section position information (a cross-section image obtaining process at step S12). Based on coordinates of an existence position of the particular observation target object observed and obtained by using the optical microscope column (optical microscope) 13, an SEM image of a particular portion that is a small portion including the coordinates of the particular observation target object is obtained. In addition, a processing position for the focused ion beam 21, an SEM image, and XY coordinates in a cross section (for example, coordinate with an SEM image as the center) are preserved as one set. For example, when multiple particular observation target objects are present in one cross section, an SEM image of particular regions respectively including the multiple particular observation target objects is obtained.

Next, whether obtaining an image of the particular observation target object has been completed is determined at step S13. Whether processing using the focused ion beam 21 is reached at a predetermined Z-coordinate (for example, Z1B), which indicates processing termination, is determined. In addition, when determining that the processing is reached at the predetermined position, obtaining image data of a particular region including the particular observation target object is completed.

In addition, obtaining an image and processing using the focused ion beam 21 with narrow intervals are terminated. Cross-section processing using the focused ion beam 21 is performed with wide intervals until the processing is reached to a portion including a subsequent particular observation target object. When there is no subsequent particular observation target object, the processing is terminated.

As described above, through the observation using the optical microscope column (optical microscope) 13, it is possible to identify in an existence position (coordinate) of a particular observation target object in a sample in advance. Therefore, it is possible to perform processing rapidly until reaching to a particular region including the particular observation target object with wide processing width. In addition, an image of a portion in which a particular observation target object is not present is not obtained, and thus time for observation may be minimized and a memory region of the image may be small. In addition, it is possible obtain information of a cross section in detail. In addition, it is possible to set whether or not an image is obtained despite a consistent processing width, and thus time may be shortened and memory requirements may be small.

Next, by using cross section position information and image data, a three-dimensional image of a particular observation target object is constructed (a three-dimensional image generating process at step S14). Here, for example, by using a computer (control device 26), a three-dimensional image of the particular observation target object is obtained from multiple cross-section images of a particular region including a particular observation target object by an image processing program.

By using the three-dimensional image of the particular observation target object obtained through the three-dimensional image generating process at step S14, it is possible to observe the particular observation target object in an arbitrary viewpoint and to obtain an arbitrary cross-section image. For example, it is possible to observe an inner structure of a cell with resolution of an SEM.

Figure 5:
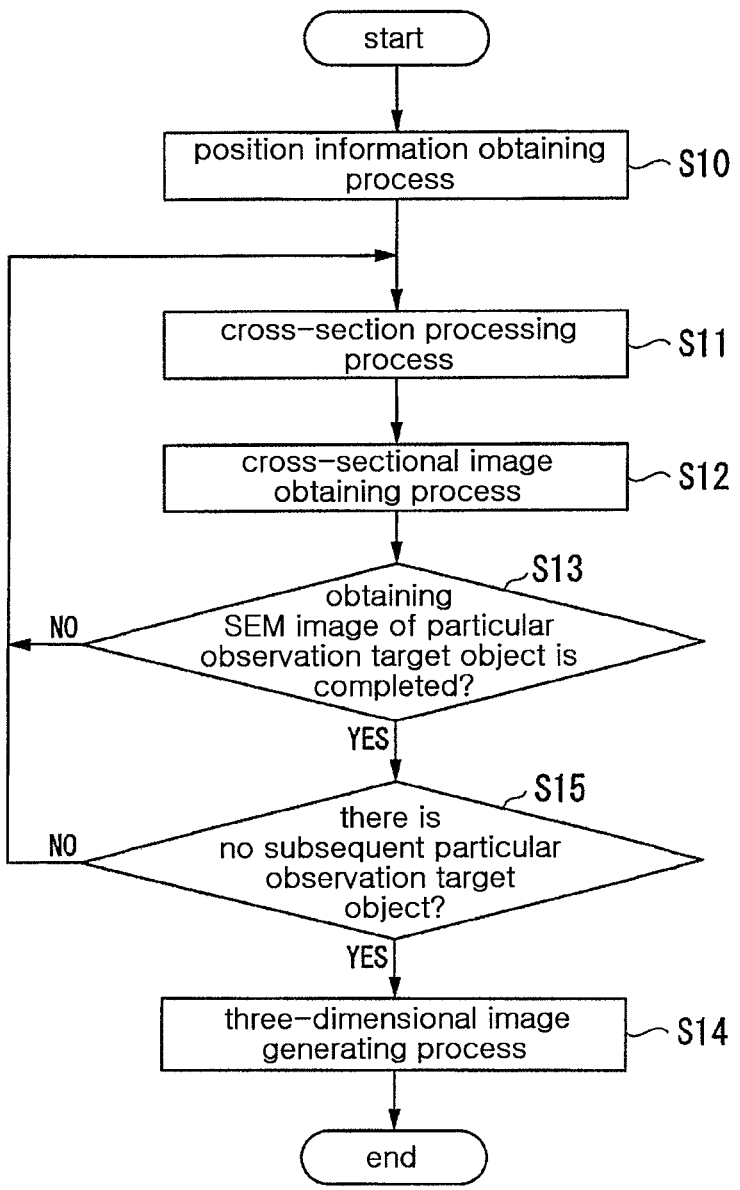
FIG. 5 is a flowchart showing a modification of a method for processing and observation.

As a modification of the method for cross-section processing and observation, as shown in the flowchart of FIG. 5, it is desirable to perform a process of determining whether or not a particular observation target object for a three-dimensional image is present at step S15 after obtaining an SEM image of a particular observation target object is completed.

In the embodiment, a case of two particular observation target objects (attention parts) is described. As a result of observation with an optical microscope, when determining a particular observation target object is only C1, cross-section processing using the focused ion beam 21 is terminated at a viewpoint of Z1B in Z-coordinate. However, as shown in FIGS. 3(A), 3(B), 4(A), and 4(B), when multiple particular observation target objects are present, according to a flowchart of FIG. 5, at viewpoint (viewpoint of Z1B in Z-coordinate) in which cross-section processing using the focused ion beam 21 with narrow intervals is terminated, whether or not another particular observation target object is present is determined at step S15. In addition, when another particular observation target object is present, a cross-section processing process S11 and a cross-section image obtaining process S12 are repeatedly performed. In addition, when another particular observation target object is not present, a three-dimensional image is obtained by the three-dimensional image generating process S14 of a particular observation target object.

Method for Cross-Section Processing and Observation: Second Exemplary Embodiment In the first exemplary embodiment, as the most simple example where multiple particular observation target objects (attention parts) are present, an example where the particular observation target objects are separated from each other, and thus only one particular observation target object is present in a certain cross section is described, but it is not limited thereto.

In the second exemplary embodiment, an example where multiple particular observation target objects (attention parts) are present in the same XY surface (same Z-coordinate) is described. The present invention is applied for observation of such a sample.

Figure 8A:
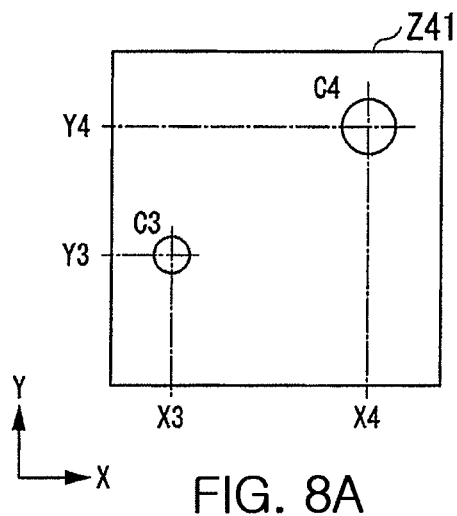
FIGS. 8(A) and 8(B) are projection views in regard to a method for cross-section processing and observation according to a second exemplary embodiment of the present invention.
Figure 8B:
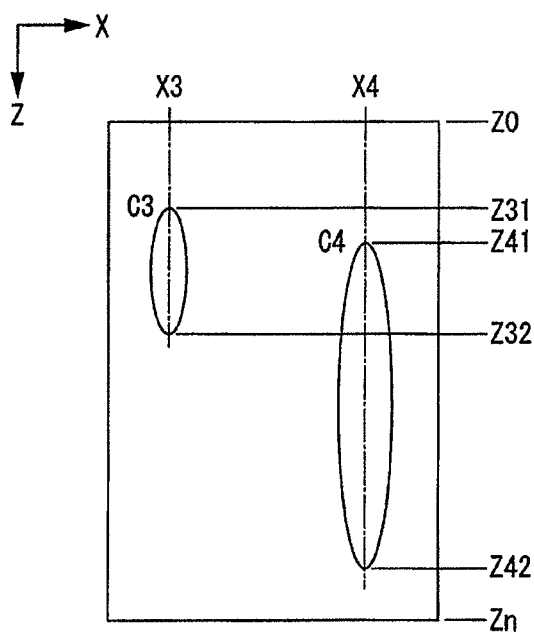

FIGS. 8(A) and 8(B) show a cross section of an XY surface (Z viewpoint) and a projection view (schematic view) of the XZ surface (Y viewpoint) that are generated from image information obtained by observing a sample, which is a target, with an optical microscope in advance. In addition, the same elements of FIGS. 3, 8(A), and 8(B) are designated by the same reference numerals, and repetitive description of the same elements is omitted.

In the second exemplary embodiment, particular observation target objects C3 and C4 are present in the same Z coordinate, and one particular observation target object is smaller than the other. When a processing cross section is related to Z31 in Z-coordinate, the particular observation target object C3 appears in a cross section. Here, in the same manner as the above-described method, an SEM image of a particular portion that is a predetermined observation portion for the particular observation target object C3 is obtained, and cross-section processing using the focused ion beam 21 starts with predetermined time and intervals.

During processing the particular observation target object C3 and obtaining an image thereof, when a processing cross section is related to Z41 in Z-coordinate, another particular observation target object C4 appears. It is already known that the particular observation target object C4 is an object that is long in a Z direction due to preliminary observation with an optical microscope. In an example of FIGS. 8(A) and 8(B), the particular observation target object C3 and the particular observation target object C4 are exposed in the same cross section from Z41 to Z32 in Z-coordinates.

Intervals of cross-section processing using the focused ion beam 21 between Z41 and Z32 in Z-coordinates are intervals corresponding to the particular observation target object C3. Even after Z32 in Z-coordinate in which the particular observation target object C3 disappears, the same processing intervals are still applied up to Z42 in Z-coordinate. Because, when processing intervals of the same particular observation target object are changed during processing, there is visual disharmony in a three-dimensional image that is finally obtained. In addition, when comparing three-dimensional images of the particular observation target object C3 and of the particular observation target object C4, the same processing intervals are applied, whereby the image may be compared in a Z direction with the same resolution.

As described above, images of the particular observation target object C3 and of the particular observation target object C4, and information of the processing intervals are preserved, thus, three-dimensional images of the particular observation target object C3 and of the particular observation target object C4 are obtained based on the preserved information.

Method for Cross-Section Processing and Observation: Third Exemplary Embodiment

An example where a particular observation target object (attention part) is present along one curved line is described in the first exemplary embodiment. However, the present invention may be applied to a case where a particular observation target object branches into multiple branches, also, to a case where multiple particular observation target objects are combined into one.

Figure 9A:
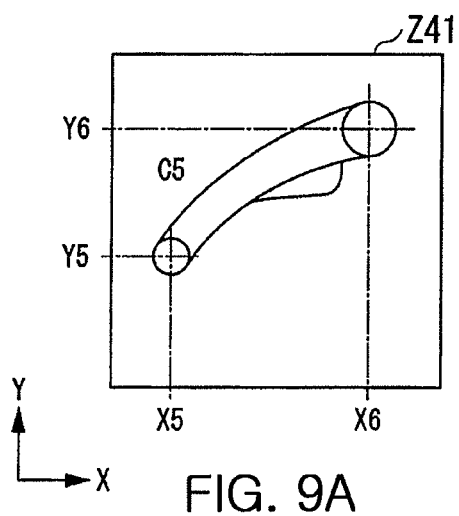
FIGS. 9(A) and 9(B) are projection views in regard to a method for cross-section processing and observation according to a third exemplary embodiment of the present invention.
Figure 9B:
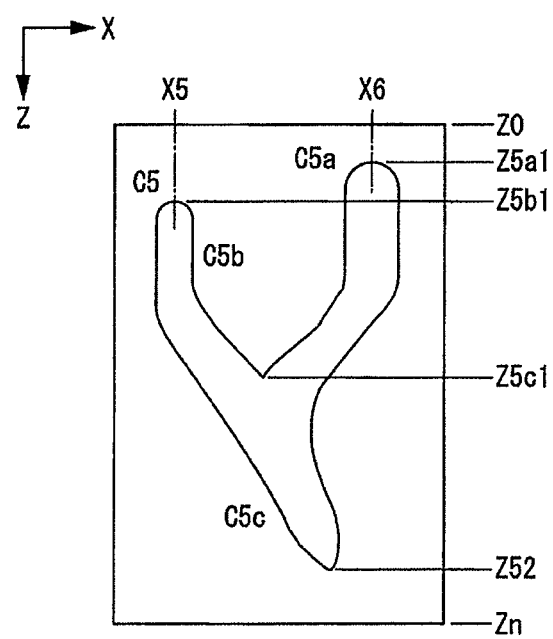

FIGS. 9(A) and 9(B) show across section of an XY surface (Z direction viewpoint) and a projection view (schematic view) of an XZ surface (Y direction viewpoint) that are obtained by observing a sample, which is a target, with an optical microscope in advance. In addition, the same elements of FIGS. 3, 9(A), and 9(B) are designated by the same reference numerals, and repetitive descriptions of the same elements are omitted.

A particular observation target object C5 is provided in a shape of being branched in the middle thereof, like a letter Y, and has the branch portions with different thicknesses that are identified by observation with an optical microscope in advance. Here, branch portions are referred to as C5a, C5b, and C5c respectively as shown in FIG. 9(B).

First, a cross section starts to be obtained from a surface (Z0 in Z-coordinate) of a sample S by using the focused ion beam 21, and the branch portion C5a of the particular observation target object C5 appears at Z5a1 in Z-coordinate. By using both processing intervals of the focused ion beam 21 and an SEM observation portion that are predetermined, processing and observation are continuously performed. When a processing cross section of the sample S is reached to Z5b1 in Z-coordinate, the branch portion C5b of the particular observation target object C5 appears.

Here, both the branch portions C5a and C5b are present in the processing cross section. When the branch portions C5a and C5b are present in the same cross section up to Z5c1 in Z-coordinate in which the branch portions C5a and C5b are combined into one, an SEM image is obtained in accordance with the size of a particular observation target object depending on a predetermined observation portion (particular portion). It is desirable to maintain processing intervals of the focused ion beam 21 until a particular observation target object disappears depending on the size of a particular observation target object that initially appeared.

In addition, an observation portion by an SEM may properly vary depending on a cross-sectional area of a particular observation target object. In FIG. 9(B), from Z5c1 to Z52 in Z-coordinates, a cross-sectional area of the branch portion C5c gradually become smaller. Depending on the cross-sectional area of the branch portion C5c, an observation portion may vary in accordance with a predetermined criterion. Consequently, it is possible to reduce an amount of image data of a portion in which a particular observation target object is not present. In addition, according to the method for cross-section processing and observation of the third exemplary embodiment, even though a shape of a particular observation target object is an irregular shape, the particular observation target object in the sample may be indicated in three-dimensions in high resolution. In addition, an amount of image data being recorded may be reduced. In addition, when multiple particular observation target objects having different processing and observation conditions are combined into one, conditions of a particular observation target object having dense processing intervals and high resolution, are used. Therefore, even though multiple target objects are combined into one, observation information of desired conditions may be automatically obtained.

Method of Cross-Section Processing and Observation: Fourth Exemplary Embodiment

An embodiment of a method for cross-section processing and observation according to a fourth exemplary embodiment of the present invention using an apparatus for cross-section processing and observation shown in FIG. 10 will be described with reference to FIGS. 10 through 14.

FIGS. 11, 12, 13, and 14 are explanatory drawings showing a sequence of observations in stages in a method of cross-section processing and observation according to a fourth exemplary embodiment of the present invention.

First, an X-ray CT device obtains an X-ray CT image of a sample S.

Figure 11:
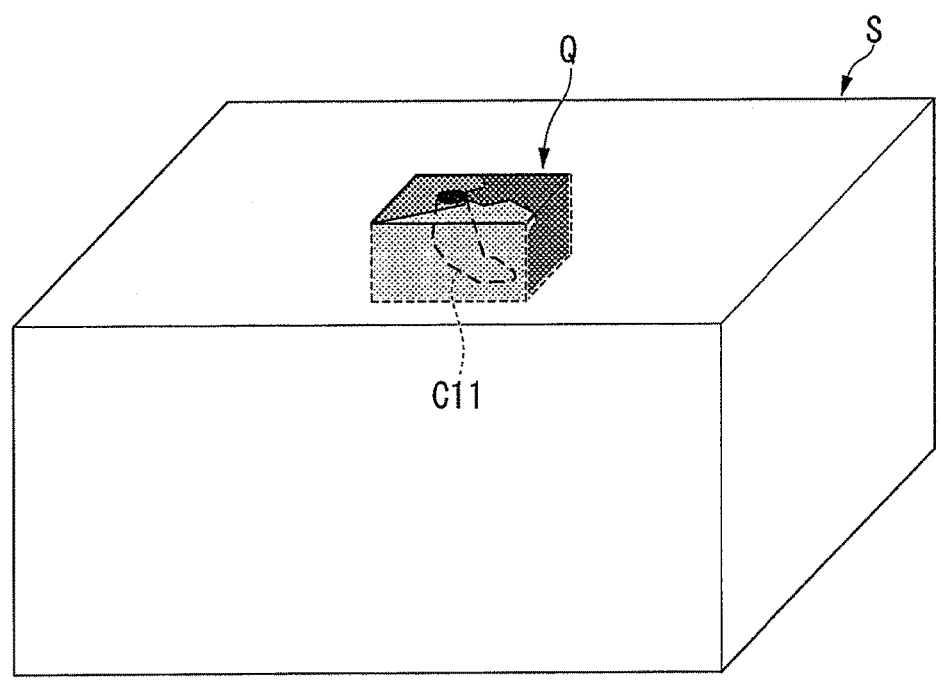
FIG. 11 is an explanatory drawing showing a method of cross-section processing and observation according to a fourth exemplary embodiment of the present invention.

Then, as shown in FIG. 11, from observation of this X-ray CT image of the sample S, a particular region (interested area) Q is determined which is a small area in the sample S including a particular observation target object (attended part) included in the sample S, and its three-dimensional position coordinate (XYZ-coordinate) information is obtained (process of obtaining position information).

Next, based on the three-dimensional position coordinate information of the particular region Q, towards the particular region Q where the particular observation target object C11 is present, focused ion beam 21 is irradiated from a focused ion beam column 11 to perform cross-section processing of the particular region Q of the sample S (process of cross-section processing). The details regarding cross-section processing of the sample S by such focused ion beam 21 are the same as for the first exemplary embodiment.

Figure 12:
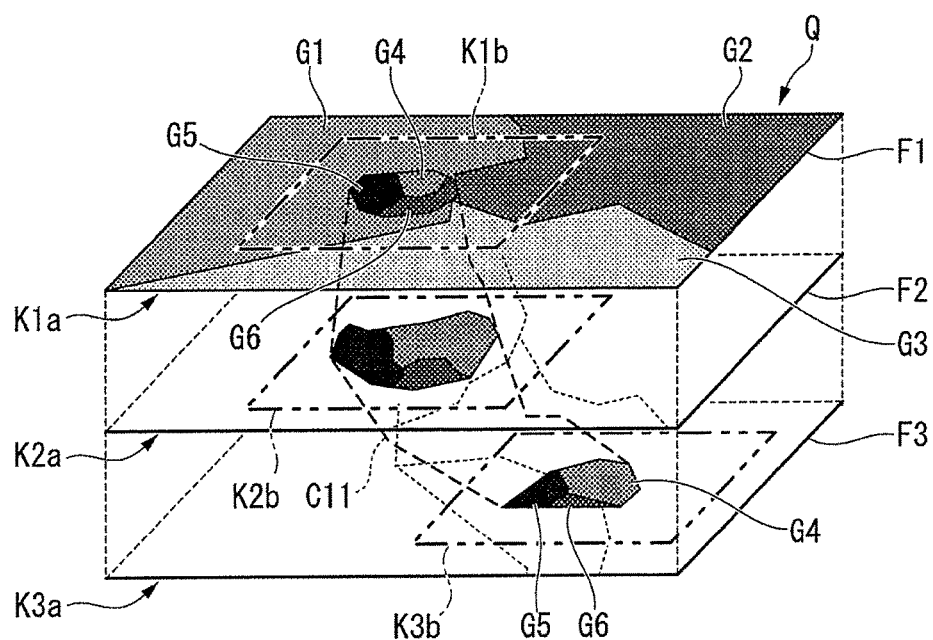
FIG. 12 is an explanatory drawing showing a method of cross-section processing and observation according to a fourth exemplary embodiment of the present invention.

Then, characteristic X-rays generated from a particular region Q of the sample S is detected from an EDS detector 51 by irradiating an electron beam (EB) 22 from an electron beam (EB) column towards the particular region Q including the particular observation target object C11 among the cross-sections of the sample S processed per certain interval. Then, as shown in FIG. 12, a cross-sectional composite image is constructed per each cross-section of the sample S. At this time, a composite image of the entirety of a certain cross-section of the particular region Q and a high resolution composite image of a small area including the particular observation target object C11 can be obtained.

For example, in the example of FIG. 12, three cross-sections F1, F2, F3 are pre-established on a particular region Q, and each of these cross-sections is processed by focused ion beam 21. Then for each cross section F1, F2, F3, a composite image of the entirety of the cross-section K1a, K2a, K3a and a high resolution composite image K1b, K2b, K3b of a small area including the particular observation target object C11 are obtained, respectively. In the example of FIG. 12, for rectangularly established cross-sections F1, F2, F3 of a particular region Q, in composite images K1a, K2a, K3a of the entirety of cross-sections, a particular observation target object (attended part) C11 is present among substances G1, G2, G3. Then, according to the high resolution cross-sectional composite images K1b, K2b, K3b, the particular observation target object C11 consists of substances G4, G5, G6.

In addition, for each processed cross-section of such a particular region Q, only the cross-sectional composite image of the entirety of the cross-section may be obtained, and, in case there are two or more particular observation target objects, high resolution cross-sectional composite images at two or more locations may be obtained. Further, cross-sectional composite images at all processed cross-section of a particular region Q or a cross-sectional composite image of a particular cross-section selectively may be obtained.

Figure 13:
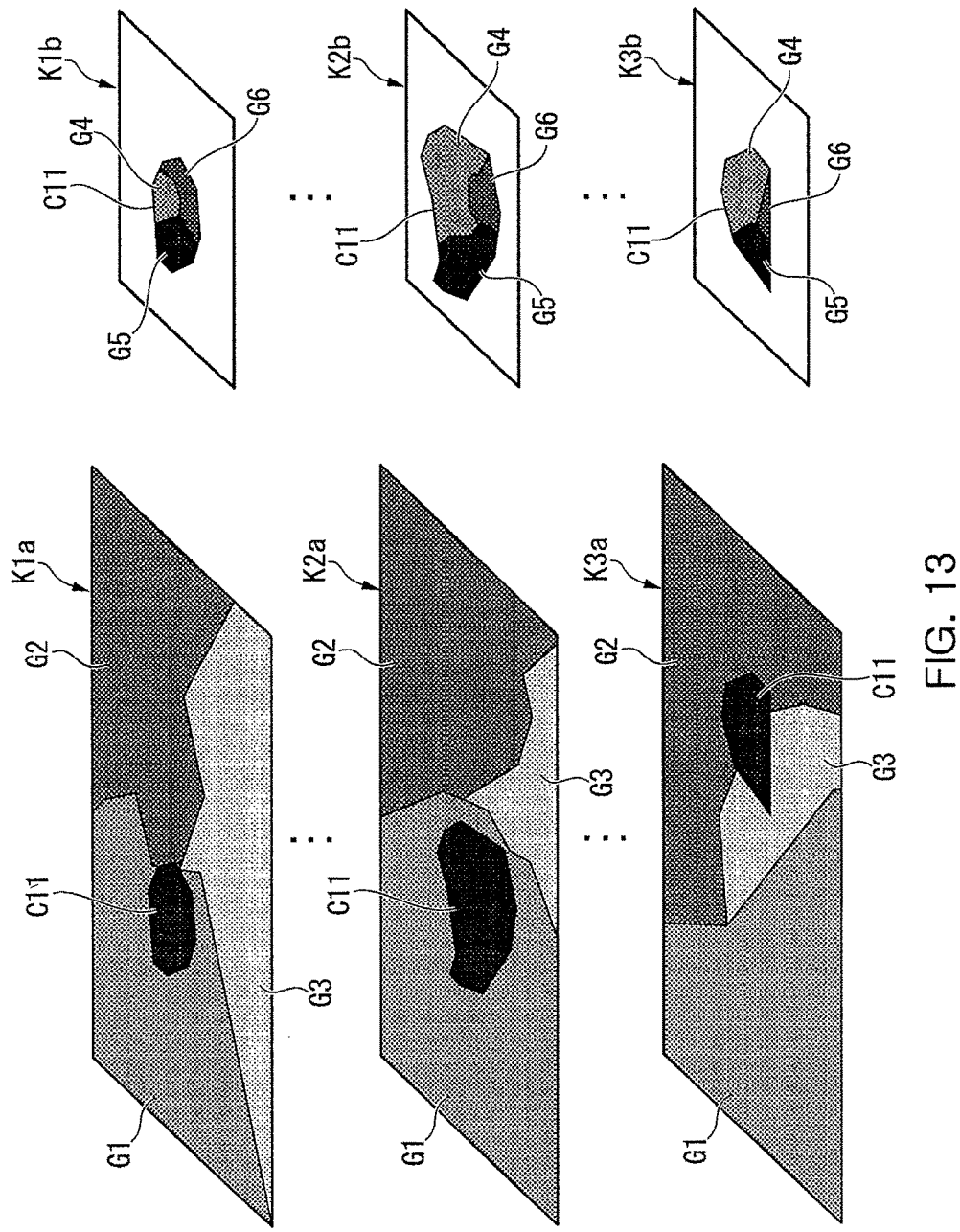
FIG. 13 is an explanatory drawing showing a method of cross-section processing and observation according to a fourth exemplary embodiment of the present invention.

By the process as above, for example, as shown in FIG. 13, for three cross-sections F1, F2, F3 of a particular region Q, composite images K1a, K2a, K3a of the entirety of the cross-sections and high resolution composite images K1b, K2b, K3b of a small area including the particular observation target object C11 are obtained.

Figure 14:
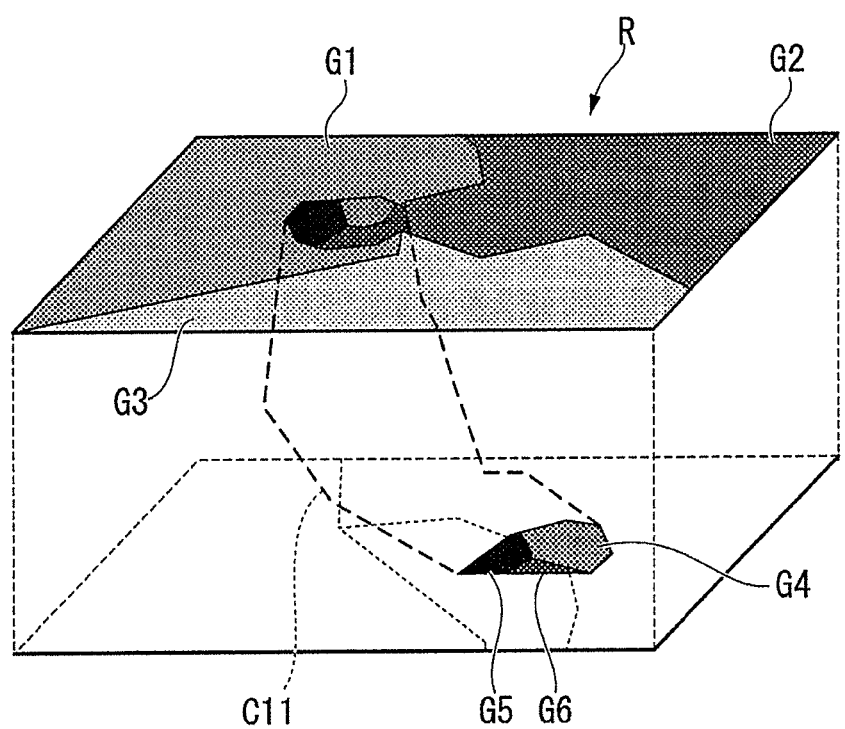
FIG. 14 is an explanatory drawing showing a method of cross-section processing and observation according to a fourth exemplary embodiment of the present invention.

Next, a three-dimensional composite image R of a particular region Q including a particular observation target object as shown in FIG. 14 is constructed using cross-sectional position information of the sample S, composite images K1a, K2a, K3a at each cross section F1, F2, F3, and high resolution cross-sectional composite images K1b, K2b, K3b (process of three-dimensional image generation). Here, for example, a three-dimensional composite image of a particular region Q including a particular observation target object is generated (constructed) by an image processing program using a computer (control device 26).

A three-dimensional composite image R obtained by a three-dimensional image generating process consists of a composition of a three-dimensional composite image showing the entire makeup of a particular region Q and a high-resolution three-dimensional composite image of a particular observation target object analyzed in high resolution.

The same as above, a three-dimensional composite image R of a particular region including a particular observation target object can be obtained from obtaining cross sectional composite image from detecting characteristic X-rays by EDS detector 51 for each processed cross-section.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for cross-section processing and observation, the method comprising:
   a process of obtaining position information, by observing the entirety of a sample of observation target through a confocal stereoscopic microscope, obtaining an approximate three-dimensional position coordinate information of a particular observation target object included in the sample;
   a process of cross-section processing, based on the three-dimensional position coordinate information, by irradiating a focused ion beam towards a particular region in which the particular observation target object is present in the sample, exposing a cross-section of the particular region;
   a process of obtaining a cross-sectional image, by irradiating an electron beam on the cross-section, obtaining an image of a region of a predetermined size including the particular observation target object; and
   a process of generating a three-dimensional image, by repeatedly performing the process of cross-section processing and the process of obtaining a cross-sectional image at predetermined intervals along a predetermined direction a plurality of times, constructing a three-dimensional image including the particular observation target object from a plurality of the cross-sectional images obtained.

2. The method of claim 1, wherein plural kinds of the particular observation target objects are set, and the process of cross-section processing is performed on each of the particular observation target objects.

3. The method of claim 1, wherein the process of obtaining a cross-sectional image comprises additionally obtaining a cross-sectional composite image of the particular region including the particular observation target object by detecting energy dispersive X-rays of the cross-section and the process of generating a three-dimensional image comprises constructing a three-dimensional composite image including the particular observation target object from a plurality of the cross sectional composite images obtained.

4. An apparatus for cross-section processing and observation, the apparatus comprising:
   a sample stage on which a sample including a particular observation target object is placed;
   a focused ion beam column that irradiates a focused ion beam on the sample;
   an electron beam column that irradiates an electron beam on the sample;
   an optical microscope column that optically observes the sample;
   a secondary electron detector that detects secondary electrons generated from the sample or a back-scattered electron detector that detects back-scattered electrons;
   an EDS detector for detecting characteristic X-rays generated from the sample; and
   a control device configured to specify a location where the particular observation target object is present within the sample by observing the entirety of the sample using the optical microscope column and obtaining an approximate three-dimensional position coordinate information of the particular observation target object included in the sample, and construct a three-dimensional image of a particular region including the particular observation target object based on the three-dimensional position coordinate information and a three-dimensional composite image of the particular region.

5. A method for cross-section processing and observation, the method comprising:
   a process of obtaining position information, by observing the entirety of a sample of observation target through an optical microscope or an electron microscope, obtaining an approximate three-dimensional position coordinate information of a particular observation target object included in the sample;
   a process of cross-section processing, based on the three-dimensional position coordinate information, by irradiating a focused ion beam towards a particular region in which the particular observation target object is present in the sample, exposing a cross-section of the particular region;
   a process of obtaining a cross-sectional image, by irradiating an electron beam on the cross-section, obtaining an image of a region of a predetermined size including the particular observation target object; and
   a process of generating a three-dimensional image, by repeatedly performing the process of cross-section processing and the process of obtaining a cross-sectional image at predetermined intervals along a predetermined direction a plurality of times, constructing a three-dimensional image including the particular observation target object from a plurality of the cross-sectional images obtained,
   wherein the process of obtaining a cross-sectional image comprises additionally obtaining a cross-sectional composite image of the particular region including the particular observation target object by detecting energy dispersive X-rays of the cross-section, and the process of generating a three-dimensional image comprises constructing a three-dimensional composite image including the particular observation target object from a plurality of the cross-sectional composite images obtained.

6. The method of claim 5, wherein plural kinds of the particular observation target objects are set, and the process of cross-section processing is performed on each of the particular observation target objects.

* * * * *